(12) United States Patent
Oehm

(10) Patent No.: US 7,504,874 B2
(45) Date of Patent: *Mar. 17, 2009

(54) TRANSISTOR ARRANGEMENT WITH TEMPERATURE COMPENSATION AND METHOD FOR TEMPERATURE COMPENSATION

(75) Inventor: Jürgen Oehm, Ratingen (DE)

(73) Assignee: Infineon Technologies AG, Munich (DE)

( * ) Notice: Subject to any disclaimer, the term of this patent is extended or adjusted under 35 U.S.C. 154(b) by 0 days.

This patent is subject to a terminal disclaimer.

(21) Appl. No.: 11/485,576

(22) Filed: Jul. 12, 2006

(65) Prior Publication Data
US 2007/0018630 A1 Jan. 25, 2007

Related U.S. Application Data

(63) Continuation of application No. PCT/DE2005/000020, filed on Jan. 11, 2005.

(30) Foreign Application Priority Data
Jan. 14, 2004 (DE) .................. 10 2004 002 007

(51) Int. Cl.
*H01L 37/00* (2006.01)
(52) U.S. Cl. .................... 327/513; 327/378
(58) Field of Classification Search ............. 327/512, 327/513, 378; 307/651; 361/24; 374/100, 374/102
See application file for complete search history.

(56) References Cited

U.S. PATENT DOCUMENTS

| 5,440,305 A | 8/1995 | Signore et al. ............ 341/120 |
| 5,774,013 A * | 6/1998 | Groe ........................ 323/312 |
| 6,198,337 B1 | 3/2001 | Matsuura ................... 327/525 |
| 6,205,010 B1 * | 3/2001 | Ohsaka et al. ............. 361/103 |
| 6,265,857 B1 | 7/2001 | Demskey et al. |
| 6,396,339 B1 | 5/2002 | Jacobs ........................ 330/9 |
| 6,466,081 B1 | 10/2002 | Eker ........................ 327/541 |
| 6,489,905 B1 | 12/2002 | Lee et al. |
| 6,674,185 B2 * | 1/2004 | Mizuta ...................... 307/651 |
| 6,674,377 B1 | 1/2004 | Li ............................ 341/120 |

(Continued)

FOREIGN PATENT DOCUMENTS

DE 40 34 371 C1 10/1991

(Continued)

OTHER PUBLICATIONS

"Digitally Trimmable Mos-Current Mirrors for High Precision Applications", Jaime Ramirez-Angulo, Institute of Electrical and Electronics Engineers, Proceedings of the International Symposium on Circuits and Systems, Chicago, 1993, vol. 2, 4 pgs.

(Continued)

*Primary Examiner*—Long Nguyen
*Assistant Examiner*—Ryan C Jager
(74) *Attorney, Agent, or Firm*—Eschweiler & Associates, LLC (57) ABSTRACT

A transistor arrangement with temperature compensation is disclosed with a transistor having at least one adjustable geometric parameter. A temperature measuring means outputs a temperature-dependent signal, depending on which a control unit drives the geometric parameter of the transistor in such a way that the electrical characteristic quantities thereof are temperature-independent. The adjustable geometric parameter may be the channel width of the transistor.

12 Claims, 7 Drawing Sheets

U.S. PATENT DOCUMENTS

| | | | |
|---|---|---|---|
| 7,148,720 B2* | 12/2006 | Chen | 326/30 |
| 7,180,211 B2* | 2/2007 | Sinha et al. | 307/651 |
| 2004/0119497 A1* | 6/2004 | Roy et al. | 326/50 |

FOREIGN PATENT DOCUMENTS

| | | |
|---|---|---|
| DE | 297 16 710 U1 | 5/1998 |
| DE | 198 42 305 A1 | 4/2000 |
| DE | 100 19 408 C2 | 10/2001 |
| EP | 0 998 022 A1 | 5/2000 |
| KR | 970008008 B1 | 5/1997 |
| WO | WO 01/75982 A2 | 10/2001 |

OTHER PUBLICATIONS

"A Wide Range dB-linear Variable Gain CMOS Amplifier", Martin Gräfe, Jürgen Oehm and Klaus Schumacher, Universität Dortmund, AG Mikroelektronik, Sep. 1997, Proceedings ESSCIRC, 4 pgs.

"A Highly Linear Operational Transconductance Amplifier for Large Signal Operations", J. Oehm and K. Schumacher, Universität Dortmund, AG Mikroelektronik, Sep. 1997, 4 pgs.

"An Integrated Low-Voltage Linear CMOS OTA", R. Wunderlich, J. Oehm, A. Dolberg, and K. Schumacher, Universität Dortmund, AG Mikroelektronik, Sep. 1997, 4 pgs.

* cited by examiner

TRANSISTOR ARRANGEMENT WITH TEMPERATURE COMPENSATION AND METHOD FOR TEMPERATURE COMPENSATION

REFERENCE TO RELATED APPLICATIONS

This application is a continuation of PCT/DE2005/000020 filed Jan. 11, 2005 which was not published in English, that claims the benefit of the priority date of German Patent Application No. DE 10 2004 002 007.8, filed on Jan. 14, 2004, the contents of which both are herein incorporated by reference in their entireties.

FIELD OF THE INVENTION

The present invention relates to a transistor arrangement in which essential transistor properties are independent of the operating temperature, the use of the transistor arrangement in an integrated semiconductor circuit, and a method for temperature compensation.

BACKGROUND OF THE INVENTION

Owing to the feature sizes of less than 0.3 µm that can be realized in modern metal oxide semiconductor (MOS) circuit technology, it has become possible to realize transceivers for signal frequencies in the GHz range. As wireless communication continues to advance into all areas of everyday life, the demand for ever higher data transmission rates is rising at the same time. Since the frequency bands in the lower GHz range that can be utilized for free wireless communication are restricted, in the future higher modulation methods will be used with the aim of transmitting higher data rates despite this restriction. The intention is not to have to increase the available channel bandwidths in this case. For some analog function groups in the transceivers, higher modulation methods such as 4QPSK or quadrature phase shift keying, require new circuitry solutions enabling linear or at least more linear signal processing. In this case, the intention is at least to maintain the hitherto achieved properties of such circuits and the advantages thereof. Moreover, compatibility with the currently existing mobile radio standards based for example on GFSK or Gaussian frequency shift keying is intended to be possible.

It is desirable, therefore, for fundamental electrical properties in MOS circuits, such as current consumption, dynamic range, gain or transition frequency, to be kept substantially constant over the technically relevant temperature range from approximately −40° to +140°. It is an aim here to keep constant not just respectively one of the characteristic quantities of integrated circuits, but rather all of said characteristic quantities concurrently over the temperature range.

In principle, MOS circuits for analog linear signal processing are known as such. By way of example, the document M. Gräfe, J. Oehm, K. Schumacher: "A Wide Range dB-Linear Variable Gain CMOS Amplifier", Proceedings ESSCIRC '97, September 1997, specifies a so-called square law circuit which can process analog voltage signals in linear fashion.

However, circuits of this type have the property that circuit characteristic quantities such as current consumption, dynamic range, gain and transition frequency cannot all be kept constant simultaneously over the technically relevant temperature range, rather temperature independence can be achieved in each case only for some of these characteristic quantities.

The constancy of the transconductance of a transistor amplifier, for example, can be improved by the current through the transistor being temperature-controlled. Over the relevant temperature range mentioned, however, it is necessary for the current to be approximately doubled in order still to be able to ensure constant conditions particularly at high temperatures. These high current consumptions are undesirable, however.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present one or more concepts of the invention in a simplified form as a prelude to the more detailed description that is presented later.

The present invention is directed to a transistor arrangement with temperature compensation that enables electrical characteristic quantities such as current consumption, dynamic range, gain and transition frequency to be kept substantially constant concurrently over the technically relevant temperature range.

According to the invention, a transistor arrangement with temperature compensation comprises at least one transistor having a control input, having a controlled path and having at least one adjustable geometric parameter. The arrangement also comprises a temperature measuring means configured to output a temperature-dependent signal, and a control unit that couples the temperature measuring means to the transistor to set the at least one geometric parameter of the transistor in a manner dependent on the temperature-dependent signal.

With regard to the method, a method for temperature compensation comprises measuring the temperature and providing a temperature-dependent signal. The method further comprises controlling at least one adjustable geometric parameter of at least one transistor in a manner dependent on the temperature-dependent signal.

In one embodiment the temperature compensation of the transistor characteristic quantities is not effected by means of a temperature control of the current through the transistor, rather at least one geometric parameter of the transistor is altered in a manner dependent on the temperature.

In this example, the at least one geometric parameter is advantageously driven and set in such a way as to provide a vanishing or least possible temperature dependence of transistor characteristic quantities such as current consumption, dynamic range, gain and transition frequency.

This results in the significant advantage that the current requirement of the circuit is not significantly increased at high temperatures.

The temperature is detected by a temperature measuring sensor or other means. This does not, however, necessitate integrating a sensor that is used separately for this purpose, rather it is possible to utilize the temperature-dependent properties of components that are in part already present.

If the transistor comprises a unipolar transistor, that is to say, by way of example, a metal oxide semiconductor (MOS) transistor, then the at least one geometric parameter may comprise the channel length and/or the channel width of the transistor.

In this example, in a manner dependent on the temperature detected by the temperature measuring means, the channel length and/or the channel width of the transistor is altered by the control unit such that the aforementioned electrical characteristic quantities of the transistor, such as current consumption, transconductance and transition frequency, remain constant or largely constant.

In one embodiment of the invention, the channel length and/or the channel width of the transistor may be adjustable in discrete steps.

The channel width and/or the channel length may advantageously be varied by virtue of the transistor being divided into a plurality of partial transistors that are connected up to one another in parallel and/or in series and can in each case be switched in and out independently of one another and individually in a manner dependent on the temperature-dependent signal. Accordingly, the channel width and/or the channel length is altered in discrete steps. Parallel circuits and/or series circuits of individual transistors that can be switched in and out can be produced particularly simply and precisely using integrated circuit technology.

In one embodiment, the control unit comprises a comparator, which compares the temperature-dependent signal supplied by the temperature measuring means with a temperature-independent signal as reference quantity and sets the at least one geometric parameter of the transistor in a manner dependent on the comparison result.

In an alternative embodiment, an assignment table may be provided, which is used to assign a control word to the temperature-dependent signal, for the purpose of setting the at least one geometric parameter of the transistor. Such a table is also referred to as a look-up table.

In one embodiment a bandgap circuit is provided for generating the temperature-independent signal.

The temperature measuring means comprises a transistor in one example. As a result, it is possible for the transistor arrangement to be driven in a manner dependent on the temperature properties of a transistor such that a high accuracy of the compensation of the temperature properties of the transistor arrangement is ensured.

The temperature measuring means may also be, by way of example, a diode path or any other temperature-dependent means.

In addition, in one embodiment a control loop may advantageously be formed by connecting a transistor having an adjustable geometric parameter into a feedback path of the comparator.

In one example the possibility of switching in and out the partial transistors that are connected up in parallel and/or in series and can be used to alter the channel width and/or the channel length of the transistor is afforded by virtue of a switching transistor being assigned to each partial transistor.

In one embodiment, in order to adjust the channel width, each partial transistor and each switching transistor form a series circuit with one another. The series circuits each comprise a partial transistor and a switching transistor connected up in parallel with one another. In this example, the switching transistors have a control input that is coupled to the control unit for switching them in and out independently of one another.

Accordingly, the desired number of partial transistors can be connected up to one another in parallel, so that the channel width of the entire transistor arrangement of the transistor whose properties are to be compensated over the temperature is adjustable.

As an alternative, instead of the switching transistor in series with the partial transistor it is also possible in each case to provide some other switching circuit, mechanism or means for switching the partial transistors in and out.

In one embodiment the partial transistors are embodied as metal insulator semiconductor transistors. In this case, the switching transistor assigned to the partial transistor may be arranged in the source path and/or in the drain path of the partial transistor.

In one example the switching transistor is in each case connected to the drain terminal of the assigned partial transistor. The arrangement of the switching transistor in the drain path of the partial transistor has the advantage that, on account of the interconnection, voltage drops across the switch practically have no effects on the amplifying properties of the stage.

In another embodiment, a cascode stage is in each case assigned to each partial transistor that can be individually switched in and out. In this example, the cascode transistor may advantageously simultaneously serve as a switch. This can advantageously be applied particularly when the transistor is electronically adjustable with regard to its electrically effective channel width.

To the accomplishment of the foregoing and related ends, the invention comprises the features hereinafter fully described and particularly pointed out in the claims. The following description and the annexed drawings set forth in detail certain illustrative aspects and implementations of the invention. These are indicative, however, of but a few of the various ways in which the principles of the invention may be employed. Other objects, advantages and novel features of the invention will become apparent from the following detailed description of the invention when considered in conjunction with the drawings.

BRIEF DESCRIPTION OF THE DRAWINGS

The invention is explained in more detail below using a plurality of exemplary embodiments with reference to drawings.

In the figures.

DETAILED DESCRIPTION OF THE INVENTION

Figure 1:
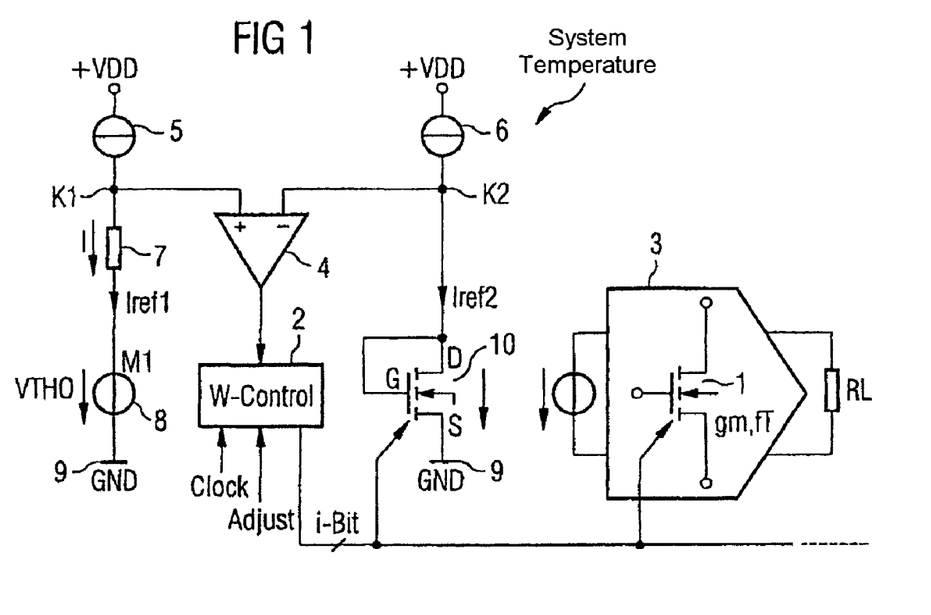
FIG. 1 is a schematic diagram illustrating a first exemplary embodiment of a transistor arrangement with temperature compensation in accordance with the invention.

FIG. 1 shows an exemplary embodiment of a transistor arrangement with temperature compensation. Provision is made of an amplifier 3 with an adjustment device for temperature compensation. A first transistor 1 has a control input and a controlled path. The transistor 1 is embodied in one embodiment as a MOS field effect transistor. The transistor 1 has an adjustable geometric parameter, namely the width of the channel in this example. A control unit 2 outputs a digital control word having a width of a plurality of bits at an output coupled to the transistor 1 for the purpose of setting the channel width of the transistor 1. The transistor 1 is arranged in an amplifier 3. The amplifier 3 may also have a plurality of transistors each having the same construction as the transistor 1 and the same driving of their channel width. A comparator 4 having two inputs is connected to an input of the control unit 2. Each input of the comparator 4 is connected to a circuit node K1, K2. Each circuit node K1, K2 is connected via a respective assigned current source 5, 6 to a supply voltage terminal VDD. The first circuit node K1 is connected to reference potential terminal 9 via a resistor 7 and a voltage source 8. The second circuit node k2 is connected to reference potential terminal 9 via a transistor 10. The transistor 10 in this embodiment comprises a MOS transistor and is configured as a diode. The voltage source 8 provides a temperature-dependent signal, namely the MOS threshold voltage VTH0. The signal provided by the voltage source 8 serves as a reference variable and has a temperature response that is excluded in calculation. The diode 10 is temperature-stable with regard to the root-mean-square gate voltage by virtue of the fact that the transistor forming the transistor diode has an adjustable channel width in the same way as the transistor 1. For this purpose, the output of the control unit 2 is likewise coupled to the transistor 10. A voltage excluded in calculation from the product of the resistance of the resistor 7 and the current flowing through it, a reference current, is dropped across the resistor 7. Said reference current may be obtained from the bandgap circuit for example in such a way that the voltage drop appears as a partial value of the bandgap voltage and is likewise temperature-stable.

In the present case, a control loop is formed by the comparator 4, the control unit 2 and the transistor diode 10. The channel width of the transistor 10 is influenced in this case. An aim of the regulation is to ensure that the voltage at the circuit node K1 and the voltage at the circuit node K2 approximately match.

The comparator 4 compares two potentials at the circuit nodes K1, K2 which arise on account of the reference currents IREF1, IREF2. The following holds true for the voltage UK1 at the first circuit node K1:

$UK1 = VTH0 + IREF1 \cdot R1$, where R1 represents the value of the resistor 7.

The following holds true for the voltage UK2 at the second circuit node K2:

$UK2 = VTH0 + Vgrms$, where the Vgrms represents the root-mean-square gate voltage.

A logic zero results from the comparison of the potentials UK1, UK2 at the output of the comparator if the following holds true: UK1<UK2. The convention may also be implemented conversely. The control unit 2 comprises a logic device which generates a control signal having the word width i in a manner controlled by the logic state at the output of the comparator. The logic of the control unit 2 is controlled either by an internal clock or an external clock. An internal clock may advantageously be derived from the signal at the comparator output. An adjust signal of the control unit 2 stores the present state of the digital control word having the word width i. As long as the adjust signal permits an alteration of the digital control word, it is altered in the sense that at the end of an adjustment cycle, the output of the comparator changes after each alteration of the digital word between logic zero and logic one. The alteration of the digital word is then only of the type such that the smallest possible alteration in the digitally controlled MOS geometries of transistor 1 and transistor 10 takes place. The voltages at the nodes K1 and K2 are then approximately identical. The maximum possible difference between the voltage nodes K1 and K2 is then determined by the smallest possible alteration in the digitally controlled MOS geometries of transistor 10. The following holds true for the voltage UK2 after the adjustment:

$UK2 = VTH0 + IREF1 \cdot R1$.

The digital control word having the word width i is present simultaneously at the amplifier 3 as well, so that all the geometry-controlled MOS transistors 1 in the amplifier 3 are likewise programmed in accordance with the result of the adjustment operation. If an operating current independent of the temperature is impressed in all the geometry-controlled MOS transistors, then at the end of each adjustment cycle, all the MOS transistors always have, independently of the operating temperature, to a good approximation the root-mean-square gate voltage Vgrms respectively provided and thus, as explained in more detail later, also the small signal transconductance gm respectively provided and the transition frequency fT provided, which are thus likewise temperature-independent.

Figure 2:
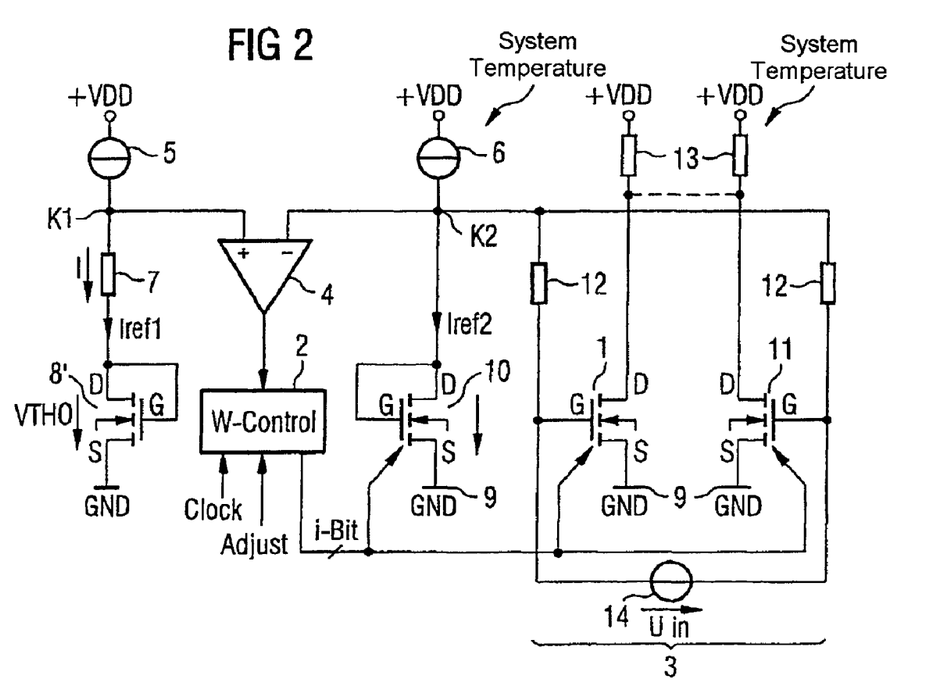
FIG. 2 is a schematic diagram illustrating a second exemplary embodiment of a transistor arrangement with temperature compensation in accordance with the invention.

FIG. 2 shows a development of the exemplary embodiment of FIG. 1, which corresponds thereto in terms of essential circuit sections, the components used, and the interconnection and advantageous functioning thereof. In this respect, the description is not repeated at this juncture.

The voltage source 8' in this embodiment comprises a transistor diode in the case of FIG. 2. For this purpose, a MOS transistor is provided, the gate terminal of which is connected to its drain terminal and thus also to the resistor 7. The amplifier 3 is embodied according to the so-called square law principle. For this purpose, a further transistor 11 is provided in addition to the at least one transistor 1. An input voltage signal Uin, which in the present case is represented by the voltage source 14, can be fed between the gate terminals of the transistors 1, 11. Furthermore, the gate terminals of the transistors 1, 11 are connected via a respective series resistor 12 to the second circuit node K2. The source terminals of the transistors 1, 11 are connected to reference potential terminal 9. The drain terminals of the transistors 1, 11 form the output of the amplifier and are additionally connected to supply potential terminal VDD via a respective load resistor 13.

Both the channel width of the transistor 1 and the channel width of the transistor 11 are altered by the control word having the word width of i bits from the control unit 2. The MOS threshold voltage VTH0 is obtained with the aid of the transistor 8 in that the latter is dimensioned for the current IREF1 such that the voltage drop from drain to source corresponds as exactly as possible actually to the MOS threshold voltage VTH0. The transistor 8' then operates in moderate channel inversion or at the limit with respect to the subthreshold voltage range.

At the end of a temperature adjustment cycle, the root-mean-square gate voltage Vgrms of the transistor 10 is equal or approximately equal to the product of the value of the resistor R1 and the reference current IREF1. The voltage UK2 at the second circuit node K2 is transferred to the gate terminals of the transistors 1, 11 with the aid of the resistors 12. The root-mean-square common-mode gate voltage of the transistors 1, 11 therefore has the same value as the root-mean-square gate voltage of the transistor 10. The digital control word is present simultaneously at the transistors 1, 11, 10. The current ratio between the second reference current IREF2 and the third reference current IREF3 in the two paths 1, 11 of the amplifier 3 always remains the same independently of the digital word.

For the case where the second reference current IREF2 remains constant over the temperature, a temperature-independent common-mode operating current is impressed in all the geometry-controlled MOS transistors 1, 10, 11. Therefore, at the end of an adjustment cycle, they always have, independently of the operating temperature, to a good approximation the root-mean-square gate voltage Vgrms respectively provided and thus, as explained in more detail below, the small signal transconductance and transition frequency respectively provided.

Accordingly, in accordance with the laws of square law amplifiers, the differential input voltage Uin is converted linearly with the transconductance gm3 of the amplifier 3 to a differential output current at the output of the amplifier 3, which is in turn converted into an output voltage Uout at the load resistors 13. For the voltage gain of the amplifier 3, which is excluded in calculation from the quotient of the differential output voltage Uout with respect to the differential input voltage Uin, it thus holds true that it is equal to the product of the small signal transconductance gm of the amplifier 3 and double value RL of the load resistor 13. The root-mean-square common-mode gate voltage and thus the voltage dynamic range that can be processed also remain constant.

Figure 3:
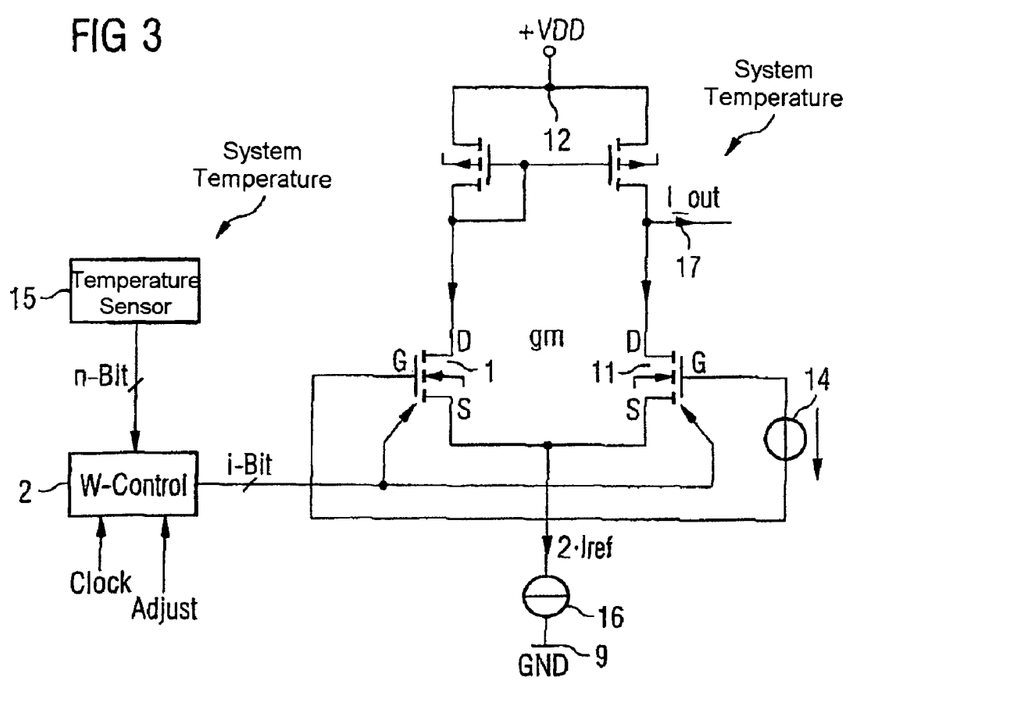
FIG. 3 is a schematic diagram illustrating a third exemplary embodiment of a transistor arrangement with temperature compensation in the case of a differential stage.

FIG. 3 shows a further exemplary embodiment of a transistor arrangement with temperature compensation. A temperature sensor 15 is provided, which is connected to the control unit 2 via a digital interface having the word width of n bits. On the output side, the control unit 2, the construction of which has already been described in FIGS. 1 and 2, is coupled to transistors 1, 11 of an amplifier arrangement for controlling the channel width of the transistors 1, 11 in a manner dependent on the measured temperature. A differential input 14 is formed between the gate terminals of the transistors 1, 11. The source terminals of the transistor 1, 11 are connected to the reference potential terminal 9 via a common current source 16. The drain terminals of the transistors 1, 11 are connected to one another via a current mirror 12. The current mirror transistors of the current mirror 12 are connected to the supply potential terminal VDD. A single-ended output 17 of the amplifier is formed at the connecting node between the current mirror 12 and the transistor 11, a single-ended output signal being provided at the said output.

The amplifier of FIG. 3 is a differential amplifier 1, 11, 12. A table which assigns the suitable channel width to the respectively measured temperature is stored in the control unit 2. In an advantageous manner, the features of the differential amplifier 1, 11, 12 such as small signal transconductance and/or static transfer response of the differential stage can thus also be kept constant. It is evident that the invention is not restricted to application of the square law principle.

The transistors 1, 11 of the input differential stage of the differential amplifier 1, 11, 12 are digitally programmable with regard to their channel width W. At the quiescent position point, that is to say given an input voltage Uin of 0 at the input 14 the temperature-independent reference current Iref provided by the current source 16 flows in each case through the transistors 1, 11. The transistors 1, 11 then operate in strong channel inversion. Since the route-mean-square gate voltage Vgrms of the transistors 1, 11 of the input differential stage, given a constant reference current Iref, is not a function of the common-mode position of the voltage at the input 14, it is possible, by suitably altering the digital adjustment word of the control unit I, to have the effect that the transconductance gm of the differential amplifier 1, 11, 12 remains approximately constant over the operating temperature within the scope of the digital setting accuracy. The same correspondingly holds true for the static transfer response between input voltage Uin at the input 14 and output current Iout at the single-ended output 17.

Figure 4:
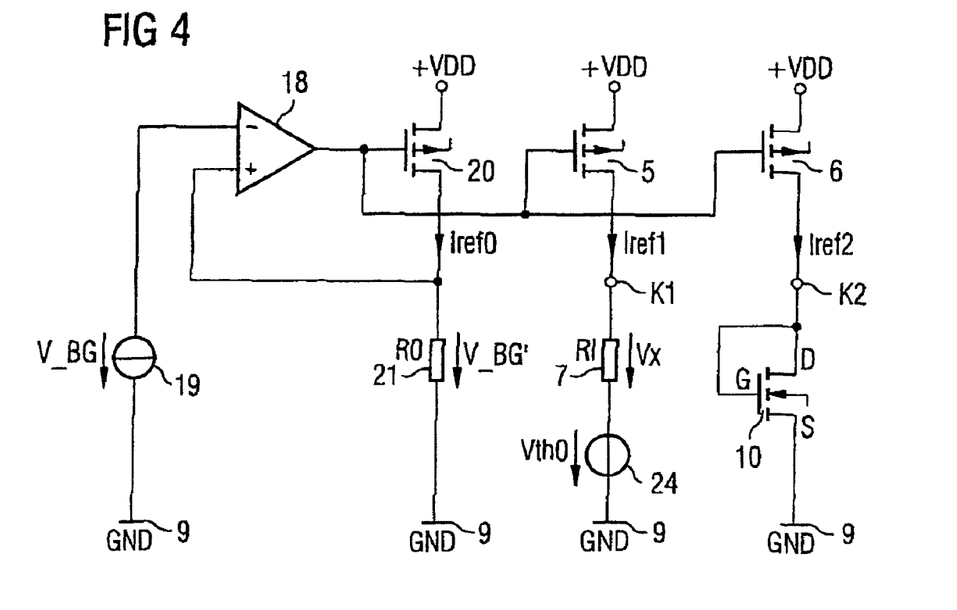
FIG. 4 is a schematic diagram illustrating an exemplary embodiment of a circuit arrangement for reference current generation for application in the circuits in FIG. 1 or 2.

FIG. 4 shows an exemplary embodiment of a circuit arrangement for obtaining a temperature-independent reference current Iref1 such as may be employed in the circuits of FIG. 1 and FIG. 2. Moreover, the circuit also serves for generating a further reference current Iref2 for the transistor 10 with an adjustable channel width in the control loop of FIG. 1. In this case, the temperature-independent reference current Iref is obtained from the bandgap circuit in such a way that the voltage drop across a resistor corresponds to the bandgap voltage VGB and, like the latter, is temperature-stable. In the circuit of FIG. 4, a differential amplifier 18 is provided having an inverting input, which is connected to reference potential 9 via a bandgap voltage source 19. The output of the operational amplifier 18 is fed back via a controlled MOS transistor 20 to the non-inverting input of the operational amplifier 18. The latter is additionally connected to reference potential via a resistor 21. The output of the operational amplifier 18 drives a further transistor 5, the controlled path of which is connected to a supply potential terminal VDD at one end and is connected to reference potential terminal 9 via a resistor 7 and a voltage source 24 at the other end. The further transistor 5 operates as a current source. The current source 24 provides the threshold voltage VTH0 of a MOS transistor. The output of the operational amplifier 18 is furthermore connected to the control input of a transistor 6 operating as a current source. The controlled path of the transistor 6 is arranged in series with the transistor 10 between the supply potential terminal VDD and the reference potential terminal 9.

The voltage source 19 supplies a temperature-stable bandgap voltage VBG having a typical voltage value of 1.2 V. The control loop 18, 20, 21 ensures that the voltage VBG' is present across the resistor 21, said voltage being approximately equal to the bandgap voltage VGB. The following holds true:

$$Iref0 = \frac{V\_BG'}{R0} \approx \frac{V\_BG}{R0},$$

where R0 is the resistance of the resistor 21. For the case where the PMOS current source transistors 20, 5 are identical, approximately the same current flows in both transistors provided that the voltage drops from drain to source are large enough in each case. For the case where the resistor 21 has a negligible temperature response in the same way as the resistor 7, the reference current IREF that flows through the resistor 7 is practically temperature-independent. If the transistors 20, 5 are structurally identical and the voltage drop from drain to source is large enough, then the voltage drop Vx across the resistor 7 is excluded in calculation as $$Vx \approx V\_BG \cdot \frac{R1}{R0},$$

where R0 denotes the resistance of the resistor 21 and R1 denotes the resistance of the resistor 7. In this case, the resistors 21, 7 are advantageously embodied identically in respect to their type.

In the present case, the resistor R1 is not connected directly to ground, but rather via the voltage VTH0, which is added to the voltage Vx if the reference current exhibits no voltage dependence, relative to ground.

The resistor 7 from FIG. 4, at which the reference current Iref1 is impressed, advantageously corresponds to the resistor 7 from FIGS. 1 and 2. The current source 24 from FIG. 4 likewise corresponds analogously to the voltage source 8 from FIGS. 1 and 2.

Figure 5A:
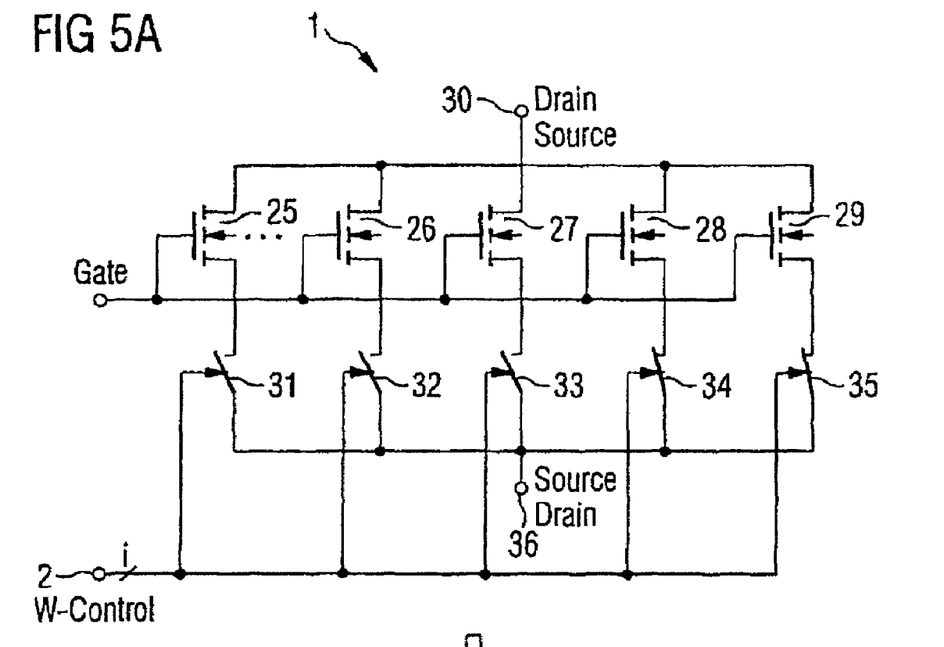
FIG. 5a is a schematic diagram illustrating an exemplary embodiment of a transistor with a digitally adjustable channel width.

FIG. 5a shows an exemplary embodiment of the at least one transistor 1 having an adjustable channel width W. In this case, the transistor comprises five partial transistors 25, 26, 27, 28, 29, the gate terminals of which are directly connected to one another and form the gate terminal of the transistor 1, and the first drain-source terminals of which are likewise connected to one another at a common node 30. The second drain-source terminals of the partial transistors 25 to 29 are connected via a respective switch 31, 32, 33, 34, 35 to a second, common drain-source node 36. The control inputs of the switches 31 to 35 are connected to the output of the control unit 2. Consequently, the switches 31 to 35 can be switched in and out independently of one another in a manner dependent on the desired total channel width.

Figure 5B:
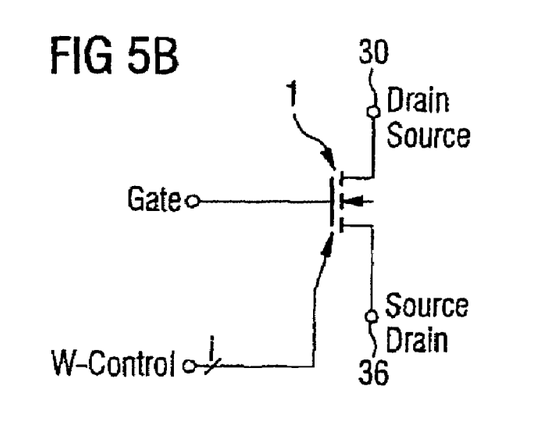
FIG. 5b is a schematic diagram illustrating an equivalent circuit diagram of the circuit from FIG. 5a, FIG. 6 is a schematic diagram illustrating an exemplary embodiment of a transistor with a digitally adjustable channel width that is switchable in the source path, and also its equivalent circuit diagram.

FIG. 5b shows an equivalent circuit diagram of the transistor 1 from FIG. 5a having an adjustable channel width W.

The transistor 1 in accordance with FIGS. 5a and 5b is suitable for application as a transistor having an adjustable geometric parameter in the transistor arrangement with temperature compensation in accordance with FIGS. 1, 2 and 3.

Since, given fixed potentials at the MOS transistor 1, the drain current scales linearly proportionally with the width, a transistor that is digitally programmable with regard to the width can be formed from i partial transistors that are connected in parallel with regard to drain, gate, source and bulk and in each case have a series switch in the current path of the partial transistor. The series switch may be situated in the drain path, in the source path or simultaneously in both paths. The staggering of the channel widths of the partial transistors 25 to 29 may advantageously be binary weighted in accordance with the specification $2^n$. However, any other subdivisions are also conceivable, depending on the required application.

Figure 6:
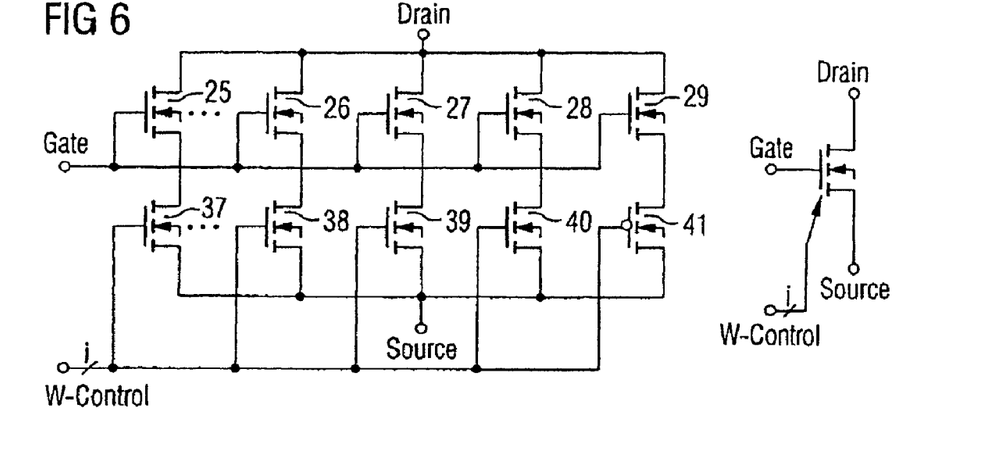

FIG. 6 shows a development of the circuit from FIG. 5a, which largely corresponds thereto in terms of construction and functioning. The switches 31 to 35 assigned to the partial transistors 25 to 29 are realized as MOS transistors 37 to 41 operated in switching fashion in the present case. The control inputs of the switches 37 to 41 form their gate terminals. The controlled path is the source-drain path.

In order to make a transistor electronically adjustable with regard to its electrically effective channel width, the switches may be arranged in series with the drain terminal or in series with the source terminal of the partial transistors 25 to 29. For reasons of the paired nature of all the switches, the latter are either all arranged in the source path or preferably all arranged in the drain path.

Figure 7:
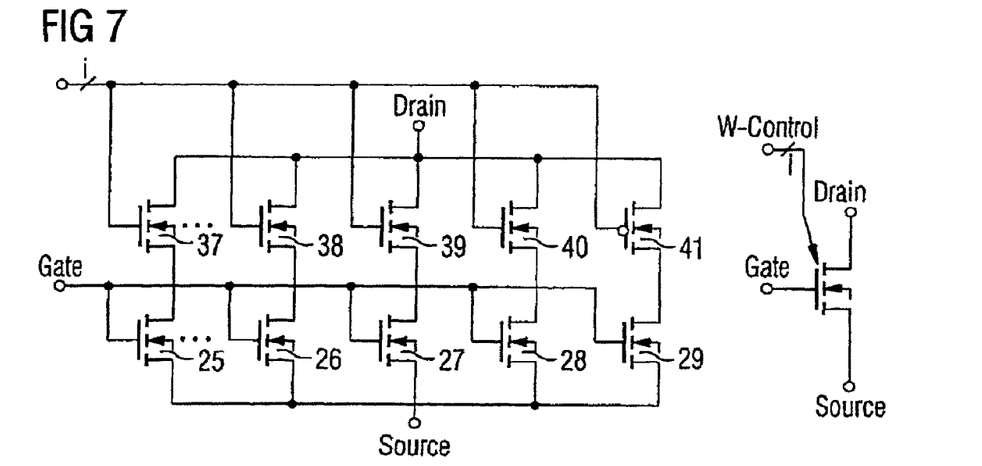
FIG. 7 is a schematic diagram illustrating an exemplary embodiment of a transistor with a digitally adjustable channel width that is switchable in the drain path, and also its equivalent circuit diagram.

FIG. 7 shows the circuit of FIG. 6, but in which the switches 37 to 41 are arranged in the drain path of the partial transistors 25 to 29. The arrangement of the switches 37 to 41 in the drain path of the partial transistors 25 to 29 has the advantage that, on account of the interconnection, voltage drops across the switches have practically no effects on the amplifying properties of the stage.

Figure 8:
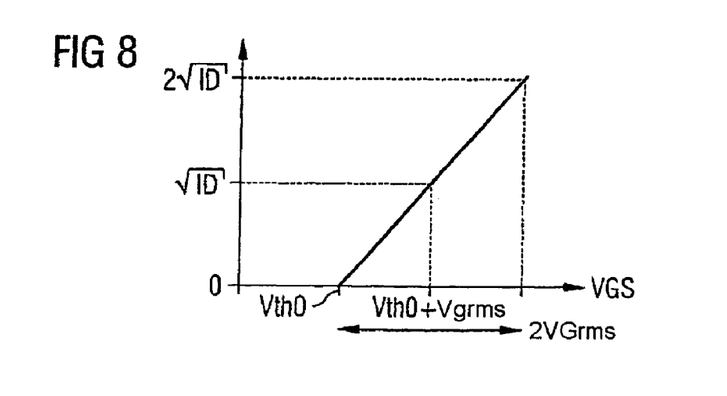
FIG. 8 is a graph illustrating the so-called square law dynamic range.

FIG. 8 is a graph illustrating the so-called square law dynamic range, which is an excursion range about the operating point. The operating point is excluded in calculation from the sum of the threshold voltage VTH0 and the root-mean-square gate voltage Vgrms. The excursion range thus corresponds to double the root-mean-square gate voltage 2·Vgrms, since it is downwardly limited by the threshold voltage VTH0. In FIG. 8, the root of the drain current ID is plotted against the gate-source voltage VGS, so that a linear relationship results. In the excursion range, the so-called square law range, corresponding to double the root-mean-gate voltage, a linear behavior results for circuits that permit linear operations on the basis of the square law principle. Accordingly, it is desirable for the root-mean-square gate voltage to be independent of the temperature, as is precisely achieved with the principle proposed. Consequently, it follows for the square law range that the processable dynamic range of a square law amplifier is temperature-independent.

The significance of the constancy of the transconductance gm over the temperature will be explained below.

The following holds true to a first order for the MOS drain current ID given strong channel inversion:

$$ID = B \cdot Vgrms^2, \quad Vgrms = Ugs - Vt,$$

where ID represents the drain current, B represents a constant, Vgrms represents the root-mean-square gate voltage, Ugs represents the gate-source voltage, and Vt represents the thermal voltage.

The MOS small signal transconductance gm is defined as:

$$gm = \frac{\partial ID}{\partial Ugs} = \frac{\partial ID}{\partial Vgrms}$$

From the formulae mentioned, it follows for the MOS small signal transconductance gm:

$$\Rightarrow gm = 2 \cdot B \cdot Vgrms$$

and $$\Rightarrow gm = gm = \frac{2 \cdot ID}{Vgrms}.$$

It follows from the last formula that given a constant root-mean-square gate voltage and a constant drain current, the transconductance gm is constant.

As a result, however, the transition frequency fT is also constant since the transition frequency is defined as the quotient of the transconductance gm divided by the MOS gate-source capacitance per unit length Cgs $$fT = \frac{gm}{2\pi \cdot Cgs}.$$

The capacitance per unit length Cgs has practically no temperature dependence, so that under the preconditions of ID being constant and Vgrms being constant, it also follows that the transition frequency fT is constant.

If a simple MOS amplifier with a load resistor and a MOS transistor is constructed, then the following holds true to a first approximation for the small signal voltage gain Vu with a resistance load RL:

$$Vu = \frac{u\_out}{u\_in} = \frac{gm}{\frac{1}{RL}} = gm \cdot RL$$

If a temperature independence is assumed for the effective load RL, then with the above preconditions in respect of the transconductance being constant, it also follows that the voltage gain Vu is constant.

Accordingly, it remains to be emphasized that given a constant drain current ID and a constant root-mean-square gate voltage Vgrms, the voltage gain Vu and the transition frequency fT and the small signal transconductance gm also remain substantially constant.

The relationship between the root-mean-square gate voltage and the transistor geometry of a MOS transistor is explained below:

For the MOS drain current ID the following holds true to a first order given strong channel inversion:

$$ID = B \cdot Vgrms^2, \text{ where}$$

$$B = KP \cdot \left(\frac{T}{Tnom}\right)^{-\frac{3}{2}} \cdot \frac{W}{2 \cdot L}$$

$$Vgrms = Ugs - Vt.$$

In this case, T represents the temperature in kelvins, $T_{nom}$ is the reference temperature in kelvins for which KP is specified, and KP is a technology constant that takes account of the mobility and the oxide thickness. For a constant drain current ID, it follows for the necessary temperature response of the root-mean-square gate voltage that:

$$\Rightarrow Vgrms \propto \left(\frac{T}{Tnom}\right)^{\frac{3}{4}}$$

The root-mean-square gate voltage Vgrms increases with temperature. In order that, given a constant current ID, Vgrms is likewise kept constant, the transistor geometries of width W and/or length L of the channel must be altered in a suitable manner. Presupposing the validity of the temperature response, the following must then hold true:

$$\frac{W_T}{L_T} = \frac{W_{Tnom}}{L_{Tnom}} \cdot \left(\frac{T}{Tnom}\right)^{\frac{3}{2}}$$

The quotient $W_T/L_T$ is the required geometric ratio at the present temperature in kelvins which is necessary in order that the root-mean-square gate voltage remains constant given a fixed drain current. The quotient $W_{Tnom}/L_{Tnom}$ is the required geometric ratio at the nominal reference temperature in kelvins which is necessary in order that the root-mean-square gate voltage has the desired nominal value at the nominal reference temperature.

In order to keep the root-mean-square gate voltage constant over the temperature, it suffices for example to suitably alter only one transistor geometry, namely width or length. From the above formula, it then follows for the transistor width that:

$$W_T = W_{Tnom} \cdot \left(\frac{T}{Tnom}\right)^{\frac{3}{2}}$$

where $L_T = L_{Tnom} = L$

Given a fixed channel length L, $W_T$ is the required transistor width at the present temperature in kelvins which is necessary in order that the root-mean-square gate voltage remains constant. The following correspondingly holds true for the transistor length $L_T$:

$$L_T = L_{Tnom} \cdot \left(\frac{T}{Tnom}\right)^{-\frac{3}{2}}$$

where $$W_T = W_{Tnom} = W$$

Given a fixed channel width W, $L_T$ is the required transistor length at the present temperature in kelvins which is necessary in order that the root-mean-square gate voltage Vgrms remains constant.

It goes without saying that a transistor geometry in the layout is a fixed, invariable quantity. In the present case, however, the transistor is preferably composed of a multiplicity of individual MOS transistors, a subset of the transistors being added to or removed from the effective MOS transistor by switching by means of switches. Therefore, the effective MOS transistor geometry is made digitally adjustable in discrete steps.

The table below describes the temperature response for the required alteration of the transistor width given a fixed channel length and given a fixed drain current which is necessary according to the above mathematical relationships in order to keep the root-mean-square gate voltage constant. In this case, Tnom is −40 degrees Celsius, that is to say approximately 233 degrees kelvins.

| | X = −40° C. | X = +27° C. | X = +100° C. | X = +140° C. |
|---|---|---|---|---|
| $\left(\frac{273+X}{273-40}\right)^{\frac{3}{2}}$ | 1.00 | 1.46 | 2.03 | 2.36 |

The tables below show, for different values of the root-mean-square gate voltage, how, given a fixed channel length and given a fixed drain current, the channel width W has to change in order that the root-mean-square gate voltage in each case remains constant over the temperature.

|        | −40° C.            | +27° C.            | +100° C.           | +140° C.           |
|--------|--------------------|--------------------|--------------------|--------------------|
| Vgrms  | 300 mV             | 300 mV             | 300 mV             | 300 mV             |
| ⇒W     | 3.3 μm (*1.00)     | 4.73 μm (*1.43)    | 6.8 μm (*2.06)     | 8.29 μm (*2.51)    |
| ⇒gm    | 544.60 μS (*1.00)  | 574.68 μS (*1.06)  | 626.32 μS (*1.15)  | 660.71 μS (*1.21)  |
| Vgrms  | 200 mV             | 200 mV             | 200 mV             | 200 mV             |
| ⇒W     | 6.53 μm (*1.00)    | 9.77 μm (*1.5)     | 15.08 μm (*2.31)   | 19.11 μm (*2.93)   |
| ⇒gm    | 0.833 mS (*1.00)   | 0.893 mS (*1.07)   | 0.974 mS (*1.17)   | 1.007 mS (*1.21)   |
| Vgrms  | 100 mV             | 100 mV             | 100 mV             | 100 mV             |
| ⇒W     | 20.14 μm (*1.00)   | 32.1 μm (*1.59)    | 52.19 μm (*2.59)   | 66.45 μm (*3.3)    |
| ⇒gm    | 1.48 mS (*1.00)    | 1.52 mS (*1.02)    | 1.5 mS (*1.01)     | 1.45 mS (*0.98)    |

The following parameters were assumed in this case: channel width 0.5 μm, the drain current 100 μA, the threshold voltage 0.4 V, TOX 6 nm and n-channel type. Vgrms denotes the root-mean-square gate voltage, W denotes the channel width and gm denotes the transconductance.

Comparison of the theoretical 1st order alteration of the transistor width according to the above formula with the simulated alterations in accordance with the table shows very good correspondence. At the same time the tables show that in the case of the chosen MOS simulation model given a constant drain current and a constant root-mean-square gate voltage, the transconductance gm is also practically constant.

Below, in contrast to the above investigation and not in accordance with the principle proposed, the drain current rather than the transistor geometry is altered in order to keep the root-mean-square gate voltage constant. The same simulation model with identical boundary conditions was used in this case.

|        | −40° C.            | +27° C.            | +100° C.           | +140° C.           |
|--------|--------------------|--------------------|--------------------|--------------------|
| Vgrms  | 300 mV             | 300 mV             | 300 mV             | 300 mV             |
| ⇒ID    | 151 μA (*1.00)     | 106 μA (*0.70)     | 74 μA (*0.49)      | 60 μA (*0.4)       |
| ⇒gm    | 823 μS (*1.00)     | 607 μS (*0.74)     | 461 μS (*0.56)     | 399 μS (*0.48)     |
| Vgrms  | 200 mV             | 200 mV             | 200 mV             | 200 mV             |
| ⇒ID    | 76.6 μA (*1.00)    | 51.3 μA (*0.67)    | 33.3 μA (*0.43)    | 26.2 μA (*0.34)    |
| ⇒gm    | 638 μS (*1.00)     | 458 μS (*0.72)     | 323 μS (*0.51)     | 264 μS (*0.41)     |
| Vgrms  | 100 mV             | 100 mV             | 100 mV             | 100 mV             |
| ⇒ID    | 24.9 μA (*1.00)    | 15.6 μA (*0.63)    | 9.6 μA (*0.39)     | 7.6 μA (*0.30)     |
| ⇒gm    | 369 μS (*1.00)     | 237 μS (*0.64)     | 144 μS (*0.39)     | 109 μS (*0.3)      |

It is evident that in the case of compensation by means of drain current instead of transistor geometry, the required current change is very large and, moreover, the transconductance does not remain constant, but rather likewise changes greatly.

Figure 9:
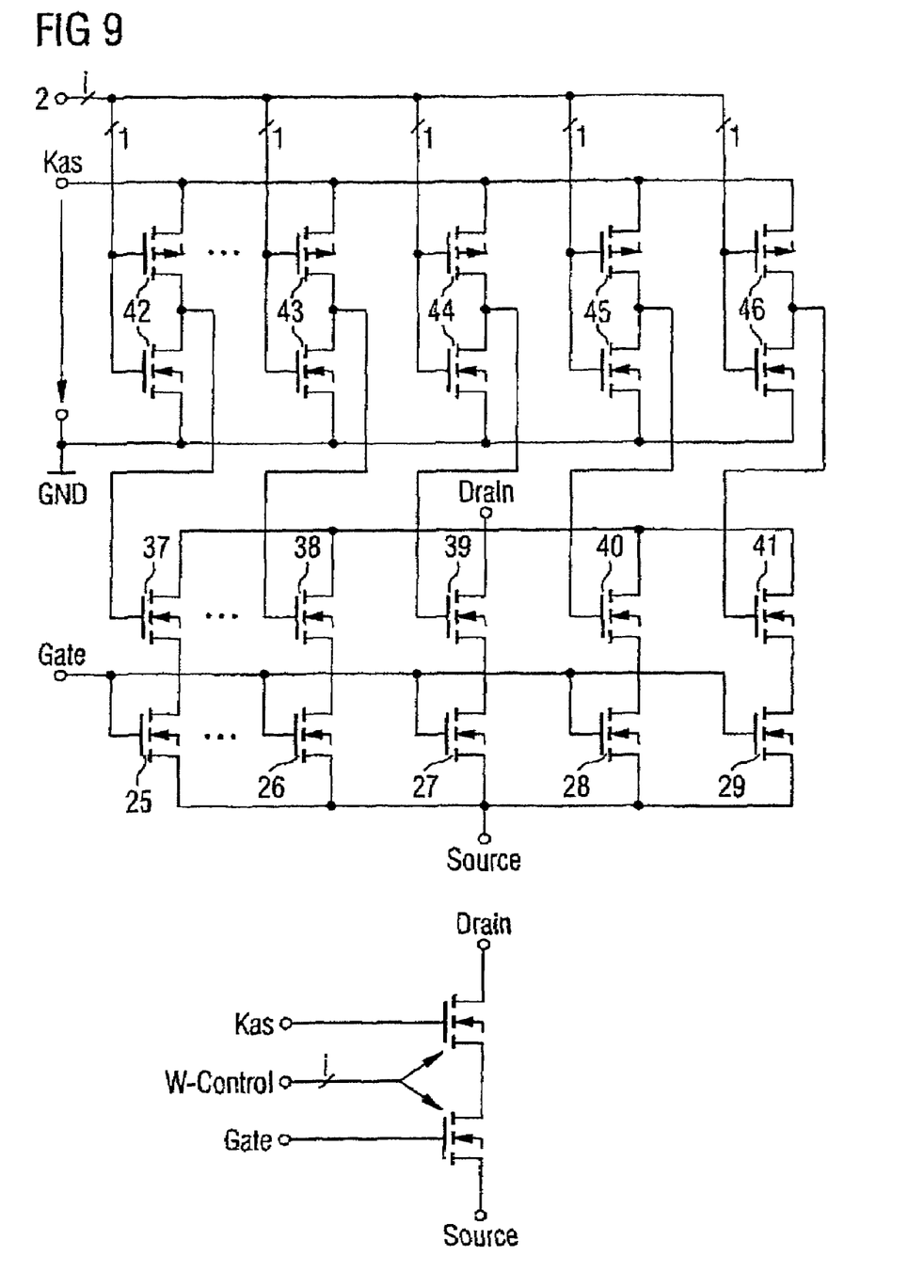
FIG. 9 is a schematic diagram illustrating an exemplary embodiment of a transistor with a digitally adjustable channel width and cascode stage, and also its equivalent circuit diagram.

FIG. 9 shows, on the basis of an exemplary embodiment, a MOS transistor with an adjustable channel width, a cascode stage that simultaneously serves as a switch being provided in the case of this MOS transistor.

The partial transistors are connected up as in FIGS. 5a, 6 and 7 and are designated by reference symbols 25, 26, 27, 28, 29. As already shown in FIG. 7, a respective switching transistor 37, 38, 39, 40, 41 is connected into the drain paths of the partial transistors 25 to 29, and simultaneously forms a cascode stage for the partial transistor 25, 26, 27, 28, 29 assigned to it. However, the cascode transistors 37, 38, 39, 40, 41 operating as switches are not driven directly by the control unit 2, rather an inverter stage 42, 43, 44, 45, 46 is interposed in each case, the output thereof being connected to the assigned control input of the switches 37 to 41. The inputs of the inverters 42, 43, 44, 45, 46 are connected to the output of the control unit 2. The supply voltage VKAS of the inverters is chosen such that, upon activation of the respective inverter, the desired cascode voltage is present as an analog reference voltage at the respective cascode transistor 37, 38, 39, 40, 41 and the respective assigned partial transistor 25, 26, 27, 28, 29 is thereby simultaneously activated. In the case of a logic zero at the inverter output, by contrast, the cascode transistor is switched to be de-energized, that is to say that the assigned partial transistor is inactive. Consequently, the functions of a Kascode circuit can be combined with that of the switching transistors without any problems and in a space-saving manner.

Figure 10:
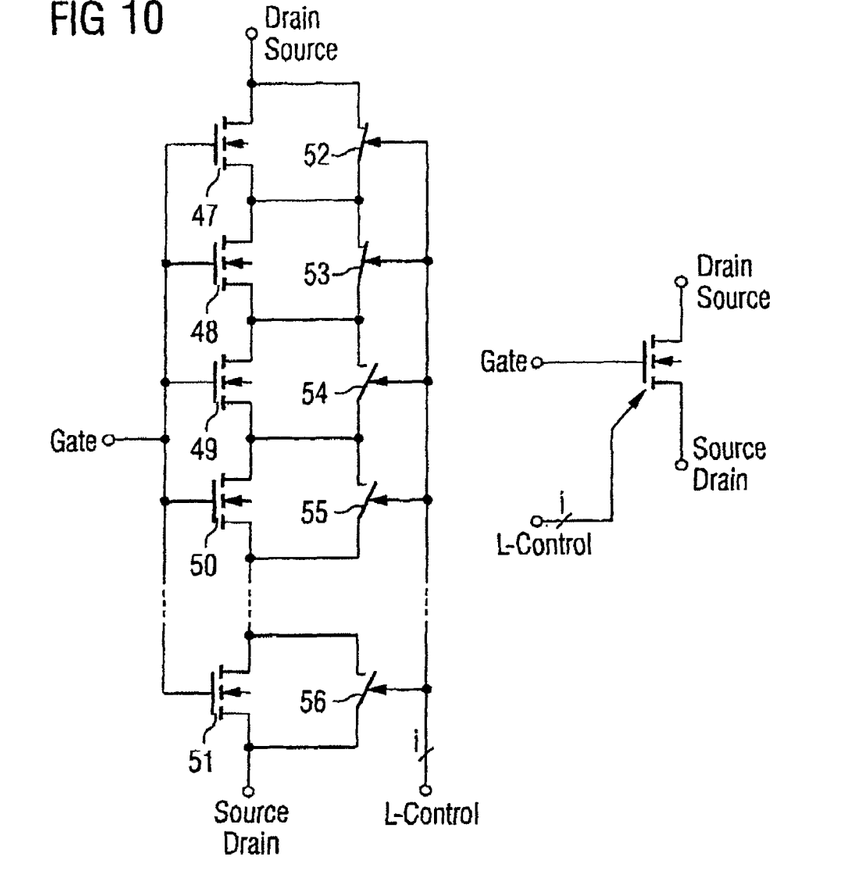
FIG. 10 is a schematic diagram illustrating an exemplary embodiment of a transistor with a digitally adjustable channel length, and also its equivalent circuit diagram.

FIG. 10 shows an exemplary embodiment of a transistor with an adjustable channel length. A multiplicity of partial transistors 47, 48, 49, 50, 51 are provided which form a series circuit with regard to their controlled paths. A switch 52, 53, 54, 55, 56 is provided in parallel with each controlled path of the partial transistors 47 to 51, the switches being driven by the control unit 2. Since, given fixed potentials at the MOS transistor, the drain current scales inversely proportionally linearly with the length, the circuit of FIG. 10 represents a transistor that is digitally programmable with regard to the channel length. The staggering of the lengths of the partial transistors 47, 48, 49, 50, 51 may be binary weighted, for example, and other subdivisions may also be advantageous.

It goes without saying that the settings of the channel width and channel length as shown in FIG. 5a and FIG. 10, by way of example, may also be combined with one another.

Figure 11:
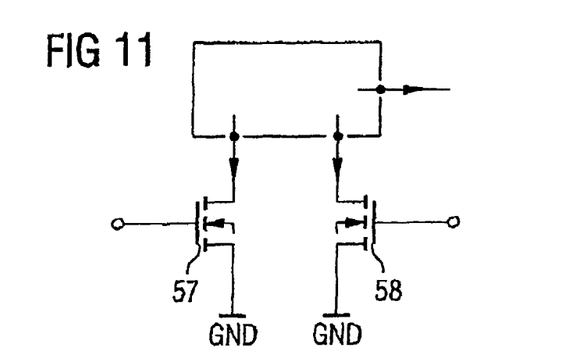
FIG. 11 is a schematic diagram illustrating a square law amplifier.

FIG. 11 shows the basic principle of a square law amplifier the example of which is to be used to explain further advantageous properties of the principle proposed.

The gate potentials of the MOS transistors 57, 58 of the amplifier of FIG. 11 are subjected to excursion in exactly opposite senses about the common-mode position excluded in calculation from the sum of the threshold voltage Vth0 and the root-mean-square gate voltage Vgrms, as shown in FIG. 8. The transistors are subjected to excursion by the magnitude of the input voltage Uin in opposite senses about said common-mode position. The following holds true to a first approximation for the drain current given strong channel inversion:

$$ID = B \cdot Vgrms^2, \quad Vgrms = Ugs - Vt$$

$$(Vsb = 0 \Rightarrow Vt = Vth0)$$

The signal output current ΔIOUT of interest from the amplifier results from the two current paths of the amplifier as:

$$\Delta Iout = IDr - IDl$$

Consequently, the following holds true for the partial currents IDl and IDr:

$$IDr = B \cdot (Vgrms - Uin/2)^2$$

$$IDl = B \cdot (Vgrms + Uin/2)^2$$

It thereby follows for the signal output current ΔIOUT that:

$$\Rightarrow \Delta Iout = B \cdot 2 \cdot Vgrms \cdot Uin$$

It should be noted that the output current is linearly proportional to the input voltage.

The small signal transconductance gm is defined as $$gm = \frac{\partial(\Delta Iout)}{\partial Uin}$$

The following results for the small signal transconductance:

$$\Rightarrow gm = B \cdot 2 \cdot Vgrms$$

It is evident that the small signal transconductance is not a function of the input voltage. This means that the small signal transconductance is equal to the large signal transconductance $$\Rightarrow gm = Gm,$$

so that a good large signal linearity is provided.

The following thereby holds true for the output current and the large signal transconductance $$\Rightarrow \Delta Iout = Gm \cdot Uin$$

$$Gm = gm = B \cdot 2 \cdot Vgrms$$

The last equality is fulfilled as long as the partial drain currents IDr, IDl that are combined to form the output current are greater than zero.

Figure 12:
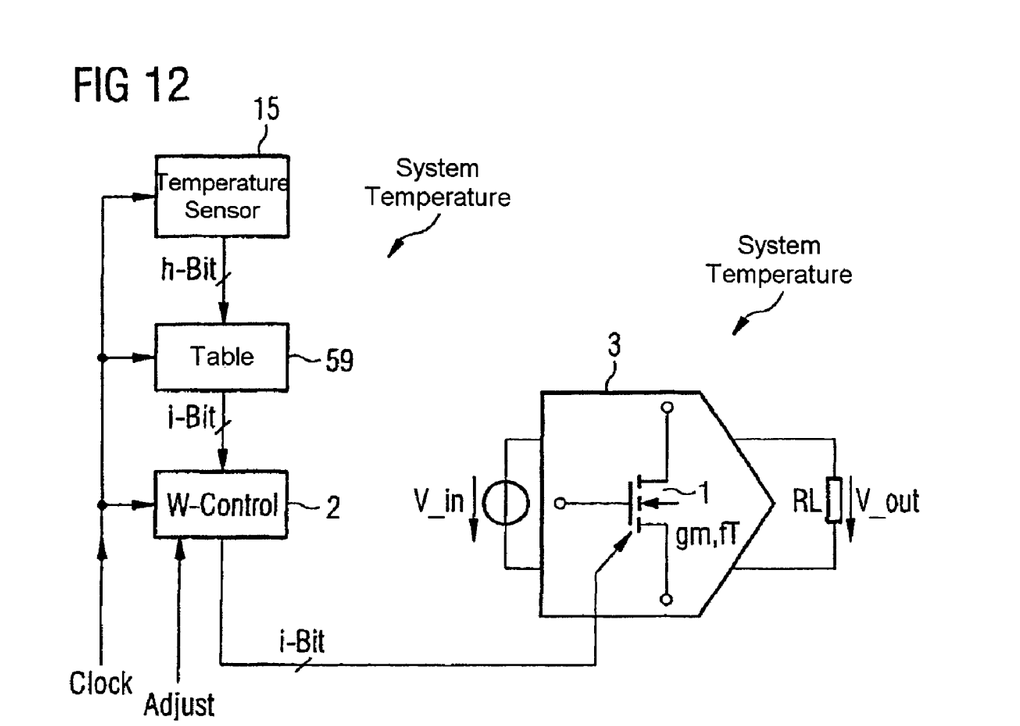
FIG. 12 is a schematic diagram illustrating a fourth exemplary embodiment of a transistor arrangement with temperature compensation in accordance with the invention.

FIG. 12 shows a further exemplary embodiment of a transistor arrangement with temperature compensation in accordance with the principle proposed. An amplifier 3 is provided, comprising at least one transistor 1 having at least one adjustable geometric parameter. In the present case, the channel width of the transistor 1 is adjustable in discrete steps. For this purpose, a control unit 2 is provided, the output of which is coupled to the amplifier via a line having the word width of i bits. A temperature sensor 15 is coupled to the control unit 2 via an assignment table, a look-up-table 59.

The assignment table 59 assigns to each temperature value a digital control signal depending on which the control unit sets the transistor 1 in the amplifier 3 precisely in such a way with regard to its channel width that the transistor characteristic quantities such as transconductance, transition frequency and current consumption remain constant or largely constant over the temperature range. The assignment table 59 can be implemented particularly simply using digital circuit technology.

In the context of the invention, all the exemplary embodiments shown can, of course, also be embodied using complementary circuit technology. Thus, by way of example, MOS current sources can be realized both with n-channel MOS transistors and with p-channel MOS transistors. The magnitude of the zero field threshold voltage VTH0 of the transistors is not fundamentally important. It is likewise insignificant whether the circuits are constructed in a CMOS n-type well process, CMOS p-type well process, triple-well process or using similar fabrication technology. Current mirror circuits may be embodied in a simple or complex manner, for example with cascode stages. All the transistors shown may be supplemented by cascode stages with the aim of improving the transistor properties.

It goes without saying that numbers of partial transistors other than five may also be provided in order to provide an adjustable channel width and/or length.

Although the invention has been illustrated and described with respect to one or more implementations, alterations and/or modifications may be made to the illustrated examples without departing from the spirit and scope of the appended claims. In particular regard to the various functions performed by the above described components or structures (blocks, units, assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

The invention claimed is:

1. A transistor arrangement with temperature compensation, comprising:
    at least one transistor comprising a control input, a controlled path, and at least one adjustable geometric parameter;
    a temperature measuring means configured to output a temperature-dependent signal;
    a control unit configured to set the at least one geometric parameter of the transistor based on the temperature-dependent signal; and
    a comparator coupled to the control unit, and comprising inputs configured to receive a temperature-independent signal and the temperature-dependent signal,
    wherein the at least one transistor comprises a plurality of partial transistors each connected in a series circuit with an assigned switching transistor, wherein the series circuits each comprise a partial transistor and a switching transistor, and wherein each of the series circuits are connected together in parallel with one another, and wherein the switching transistors each have a control input coupled to the control unit.

2. The transistor arrangement of claim 1, wherein the transistor comprises a unipolar transistor, and the at least one geometric parameter comprises a channel length or a channel width of the transistor.

3. The transistor arrangement of claim 1, further comprising a bandgap circuit configured to generate the temperature-independent signal, wherein the bandgap circuit is connected indirectly or directly to a first input of the comparator.

4. The transistor arrangement of claim 1, further comprising a control loop comprising a further transistor having at least one adjustable geometric parameter, the further transistor coupled to the control unit and controlled thereby, and coupled to a second input of the comparator, there being connected to a first input of the comparator a means for feeding in the temperature-independent signal that is composed of a partial value of a bandgap voltage and the threshold voltage of a transistor that serves as a reference variable for the control loop.

5. The transistor arrangement of claim 1, further comprising an assignment table coupled between the temperature sensor and the control unit, and configured to assign a correction value to the temperature-dependent signal.

6. The transistor arrangement of claim 1, wherein the temperature measuring means comprises a transistor.

7. The transistor arrangement of claim 1, wherein the partial transistors each comprise metal insulator semiconductor transistors.

8. The transistor arrangement of claim 7, wherein each assigned switching transistor is connected to a drain terminal of its respective partial transistor.

9. A method for temperature compensation of a transistor, comprising:

measuring a temperature and providing a temperature-dependent signal based thereon; and controlling at least one adjustable geometric parameter of at least one transistor based on the temperature-dependent signal, wherein controlling the geometric parameter comprises varying a channel length of the transistor based on the temperature-dependent signal.

10. The method of claim 9, wherein controlling the geometric parameter further comprises varying a channel width of the transistor based on the temperature-dependent signal.

11. The method of claim 10, wherein the channel width of the transistor is varied by respectively switching in and out a plurality of partial transistors selectively connected together in parallel.

12. The method of claim 9, wherein the channel length is varied by respectively switching in and out a plurality of partial transistors selectively connected together in series.

* * * * *

UNITED STATES PATENT AND TRADEMARK OFFICE
CERTIFICATE OF CORRECTION

PATENT NO. : 7,504,874 B2  Page 1 of 1
APPLICATION NO. : 11/485576
DATED : March 17, 2009
INVENTOR(S) : Jürgen Oehm It is certified that error appears in the above-identified patent and that said Letters Patent is hereby corrected as shown below:

Title Page item (*)

Under the Notice section on the front page; please remove "This patent is subject to a terminal disclaimer" as there was no terminal disclaimer filed for this particular patent application.

Column 10, equation 3; Please replace

" $\Rightarrow gm = 2 \cdot B \cdot Vgrms$ and $\Rightarrow gm = gm = \dfrac{2 \cdot ID}{Vgrms}.$ "

with

-- $\Rightarrow gm = 2 \cdot B \cdot Vgrms$ and $\Rightarrow gm = \dfrac{2 \cdot ID}{Vgrms}.$ --.

Signed and Sealed this

Twenty-sixth Day of May, 2009

JOHN DOLL
*Acting Director of the United States Patent and Trademark Office*